United States Patent
Leva et al.

(10) Patent No.: US 6,320,463 B1
(45) Date of Patent: Nov. 20, 2001

(54) ADAPTIVE DIGITAL PRE-CORRECTION OF NONLINEARITIES INTRODUCED BY POWER AMPLIFIERS

(75) Inventors: Angelo Leva, Uboldo; Sergio Gulino, Altofon; Gianluigi Redaelli, Bernareggio; Arnaldo Spalvieri, Milan, all of (IT)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/593,154

(22) Filed: Jun. 14, 2000

(30) Foreign Application Priority Data

Jun. 15, 1999 (IT) .............................. MI99A1323

(51) Int. Cl.$^7$ ................. H03F 1/26; H03F 1/30
(52) U.S. Cl. ............. 330/149; 330/2; 330/136; 375/297; 455/63
(58) Field of Search ............... 330/2, 136, 149; 375/297; 455/63

(56) References Cited

U.S. PATENT DOCUMENTS

| | | | | |
|---|---|---|---|---|
| 6,141,390 | * | 10/2000 | Cova | 375/297 |
| 6,147,555 | * | 11/2000 | Posner et al. | 330/149 |
| 6,211,733 | * | 4/2001 | Gentzler | 330/149 |
| 6,246,286 | * | 6/2001 | Persson | 330/149 |

OTHER PUBLICATIONS

G. Santella, "Performance of Adaptive Predistorters in Presence of Orthogonal Multicarrier Modulation", International Conference on Telecommunications, pp. 621–626, Melbourne, Australia, Apr. 2–5, 1997.

* cited by examiner

*Primary Examiner*—Michael B Shingleton
(74) *Attorney, Agent, or Firm*—Sughrue, Mion, Zinn, Macpeak & Seas, PLLC

(57) ABSTRACT

A method is described for estimating at least the inverse amplitude characteristic in a high-power amplifier for transmission systems, wherein the estimation is carried out by estimation means receiving the signal samples, possibly demodulated, as inputs present at the input and at the output of the amplifier. The method is characterized in that estimation of the inverse amplitude characteristic occurs by way of a non-recursive algorithm and in that said non-recursive algorithm can be analytically translated into: if $$\alpha \equiv (r_0(t), A[r_0(t)]) \in \{r(t), A[r(t)]\} \forall r_0(t) \in [a,b] \mapsto \beta \equiv (A[r_0(t)], r_0(t)) \in \{R(t), A^{-1}(R(t))\} \forall R_0(t) \in [A(a), A(b)]$$

10 Claims, 3 Drawing Sheets

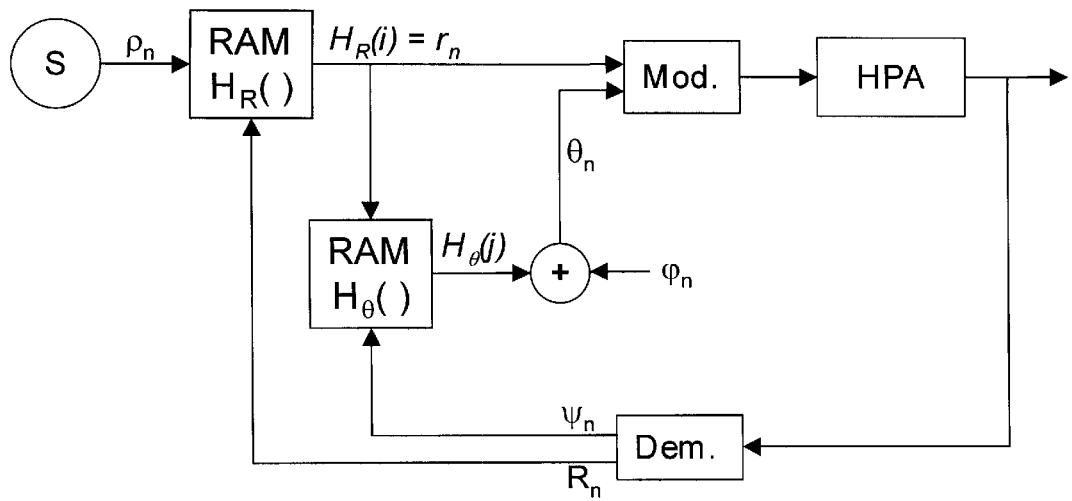
Fig. 5
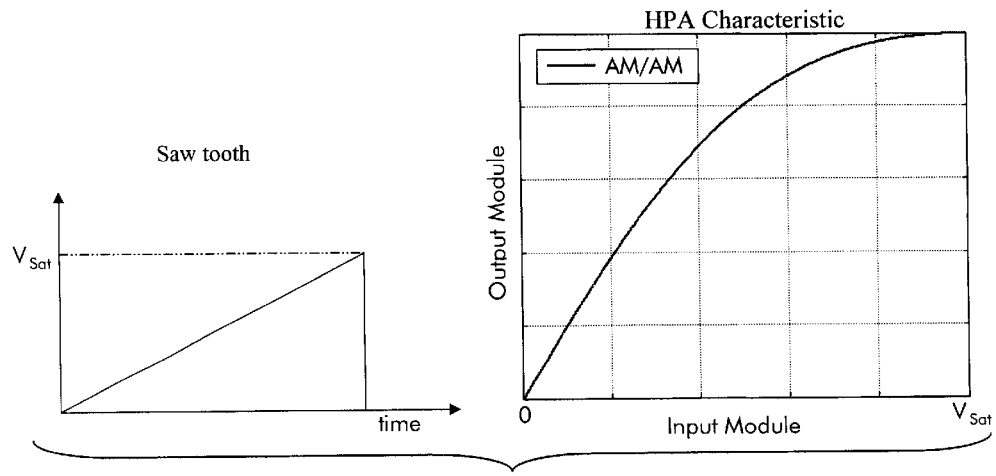
Fig. 6
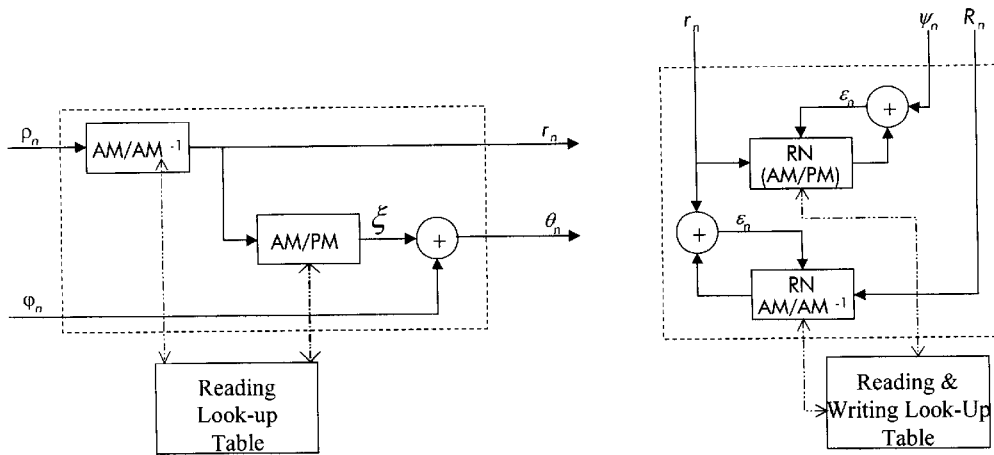
Fig. 7a  Fig. 7b

ADAPTIVE DIGITAL PRE-CORRECTION OF NONLINEARITIES INTRODUCED BY POWER AMPLIFIERS

BACKGROUND OF THE INVENTION

1. Field of the Invention

The present invention concerns the precorrection of nonlinearities in transmission systems and in particular the adaptive precorrection of nonlinearities in single-carrier or multicarrier transmission systems.

2. Description Of The Prior Art

As it is known, the final effect of the nonlinear distortion introduced by a power amplifier (HPA) is the in-band spectral energy variation and the appearance of out-of-band energies. The in-band energy variation causes a distortion in the transmitted signal (clustering: every point of the constellation scatters into a cloud of points; and warping: translation of the barycenters of the clusters), while the intermodulation products responsible for the out-of-band distortions cause interference with the adjacent channels. Both phenomena determine a reduction of the performances in terms of BER (Bit Error Rate) and of spectral efficiency.

An attenuation of these effects is obtained by using a high IBO (Input Back-Off) value, but this implies a reduction in terms of the HPA power efficiency. A more efficient solution consists in the use of predistortion techniques. In this way not only the effects due to the nonlinearities are reduced but also the power efficiency is increased, resulting in reduction of size and costs of the broadcast transmitters.

A predistortion device (PD) is a device able to generate a predistortion capable of compensating for the signal distortion introduced by the HPA. The final result of such a predistortion is the possibility of using the HPA at a higher power (lower IBO) at the same distortion or at the same power, thus providing a lower distortion.

Various predistortion techniques are known: "Feed-Forward", Predistortion" (with or without memory), and "Signal Predistortion" (at RF, IF, or BaseBand). The Feed-Forward technique is complex and fixed (not adaptive), requires a fine tuning, an additional power for the losses introduced by the main signal and an additional power for generating the signal distortion. The Data Predistortion technique only compensates for distortion at the sampling instants, does not eliminate the out-of-band distortions and is dependent on the type of modulation. Lastly, the Signal Predistortion generates a predistorted signal which should appear at the output of the HPA without any distortion. The combined effect of an ideal signal predistortion device with an HPA results in a linear function up to the saturation level (the so called ideal clipper). For this reason, the signal predistortion eliminates both in-band and out-of-band distortions until the signal exceeds the saturation level.

Theoretically, the signal predistortion can be applied at RF, at IF or in BaseBand. The RF approach is not desirable as it would theoretically require a specific circuit for each carrier and a perfect alignment at the various frequencies.

Apart from the type of implemented predistortion, a precorrection system is composed of a predistortion device (PD) and an estimator. The PD, by exploiting the information received from the estimator, performs a predistortion of the signal samples present at the input thereof. Conversely, the objective of the estimator is to estimate the phase and inverse amplitude characteristics of the amplifier. Further, it is preferable for the system to be instantaneous adaptive, having to follow possible variations of the amplifier characteristics due to thermal or aging phenomena or to the amplifier modules breakdown, i.e. in coincidence with each symbol from the source coming out from the PD, the predistorted symbol to be sent to the HPA must be obtained in real time.

It is necessary to take special care of the inverse amplitude characteristic estimation rather than the phase characteristic estimation. In particular, it would be desirable to directly estimate the inverse without having to perform further mathematical operations.

With reference to the baseband signal distortion, the precorrection system can be realized using two different schemes that differ each other as to the input data sent to the estimator: in one case (architecture "A", FIG. 1a) the estimator receives the signal samples which are present at the input ($p_n$) of the PD and those, properly demodulated, coming out ($R_n$) from the amplifier; in the other case (architecture "B", FIG. 1b) the estimator receives as inputs the signal samples, properly demodulated, coming into ($r_n$) and coming out from ($R_n$) the HPA and according to them, as in the previous case, carries out the estimation thereof A system performing the baseband signal predistortion and according to the above architecture "A" is, in particular, known in the literature (from G. Santella, "Performance of Adaptive Predistorters in Presence of Orthogonal Multicarrier Modulation", International Conference on Telecommunications, pages 621 to 626, Melbourne, Australia 2 to 5 April, 1997). The content of such a published article is deemed as incorporated in the present description as a reference. The solution proposed by Santella implements a recursive procedure, dependent on both the starting conditions and on the step-size coefficients, converging to the stable point minimizing the mean square error. According to such a solution, a transformation is applied to the signal in such a way that, when it is amplified, the effects of the nonlinearities introduced by the HPA are compensated.

Among the drawbacks of such a solution are the fact that the algorithm is unstable for values of the step-size coefficients greater than a given threshold, the fact that the values of said coefficients do not significantly affect the rate of convergence but they affect the error oscillations and lastly the fact that in order for the convergence to be achieved, it will be necessary to scan the entire characteristic of the HPA at least 3/5 times.

SUMMARY OF THE INVENTION

In view of the above prior art, the main object of the present invention is to provide a method and a device for precorrecting the nonlinearities introduced by power amplifiers in (multicarrier or single carrier) transmission systems that permits of reducing the estimation time and of performing an instantaneous inversion.

This and further objects are achieved by a method and a device according to claims 1 and 9, respectively. Further advantageous characteristics of the invention are set forth in the respective dependent claims.

The present invention utilizes the baseband signal predistortion technique realized according to the second arrangement, the architecture "B". The basic idea of the invention consists in adopting a non recursive algorithm for the estimation process of the amplifier characteristics and in particular for the estimation of the inverse amplitude characteristic.

The invention will be fully understood after reading the following detailed description, given by way of a mere exemplifying and non limiting example thereof, to be read with reference to the attached sheets of drawings.

BRIEF DESCRIPTION OF THE DRAWINGS

In the drawings:

FIG. 2 graphically represents the principle which the present is based on;

FIG. 5 shows the precorrection algorithm according to the invention;

FIG. 6 is a representation of the training signal; and

FIGS. 7a and 7b are block diagrams of the predistortion device and of the estimator according to a further solution.

BEST MODE FOR CARRYING OUT THE INVENTION

The present invention adopts a non-recursive algorithm for the estimation process of the amplifier characteristics and particularly for the estimation of the inverse amplitude characteristic. This permits of reducing the estimation time and of performing an instantaneous inversion.

The basic principle used to perform such an operation will be set forth hereinbelow.

Suppose y

32 $f(x)$ is a function that is continuous and monotone in the interval [a,b], then the function $x=f^{-1}(y)$ is called the inverse function of $y=f(x)$ and it is also continuous and monotone of the same type in $[f(a),f(b)]$. Said functions are symmetric with respect to the bisector of the first and third quadrants. This can be verified either analytically or by exploiting the properties of the inverse functions.

Figure 2:
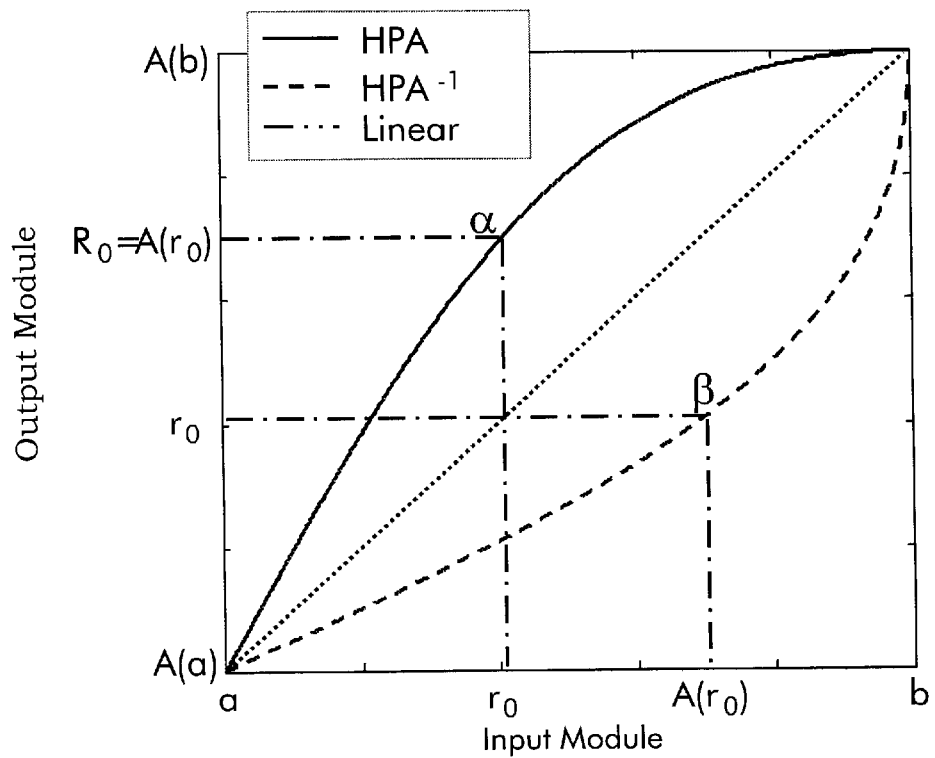

Under these conditions, given the amplitude characteristic of the amplifier $R(t)=A[r(t)]$, $r(t)$ and $R(t)$ being respectively comprised between [a,b] and [A(a),A(b)], its inverse $r(t)=A^{-1}[R(t)]$ can be estimated by using the following relation: if the point $\alpha$ having coordinates $(r_0(t),A[r_0(t)])$ belongs to the set $\{r(t),A[r(t)]\}$ for every $r_0(t)$ belonging to [a,b], then the point $\beta$ with coordinates $(A[r_0(t)],r_0(t))$ belongs to the set $\{R(t),A^{-1}(R(t))\}$ for every $R_0(t)$ belonging to [A(a),A(b)] as shown in FIG. 2. The above results in the following analytical expression:

$$\alpha \equiv (r_0(t),A[r_0(t)]) \in \{r(t),A[r(t)]\} \forall r_0(t) \in [a,b] \rightarrow \beta \equiv (A[r_0(t)], r_0(t)) \in \{R(t),A^{-1}(R(t))\} \forall R_0(t) \in [A(a),A(b)] \quad (1)$$

According to what has been said previously, it can be deduced that the HPA amplitude characteristic and its inverse are symmetric with respect to the bisector of the first and third quadrants. This implies that in order to estimate the inverse AM/AM characteristic, it will be enough to invert, symbol-by-symbol, the amplifier input-output pair and to store the point thus obtained in a Look-Up Table.

Figure 3:
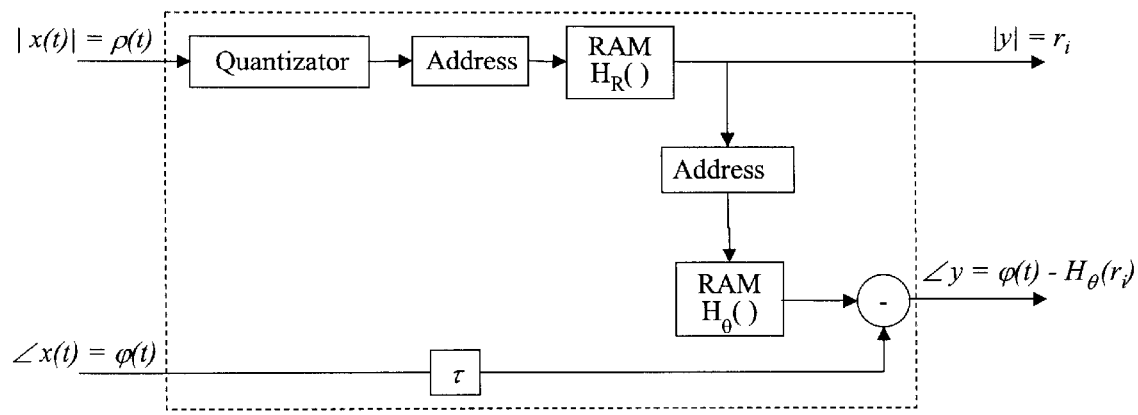
FIG. 3 is a block diagram of the predistortion device according to the invention.
Figure 4:
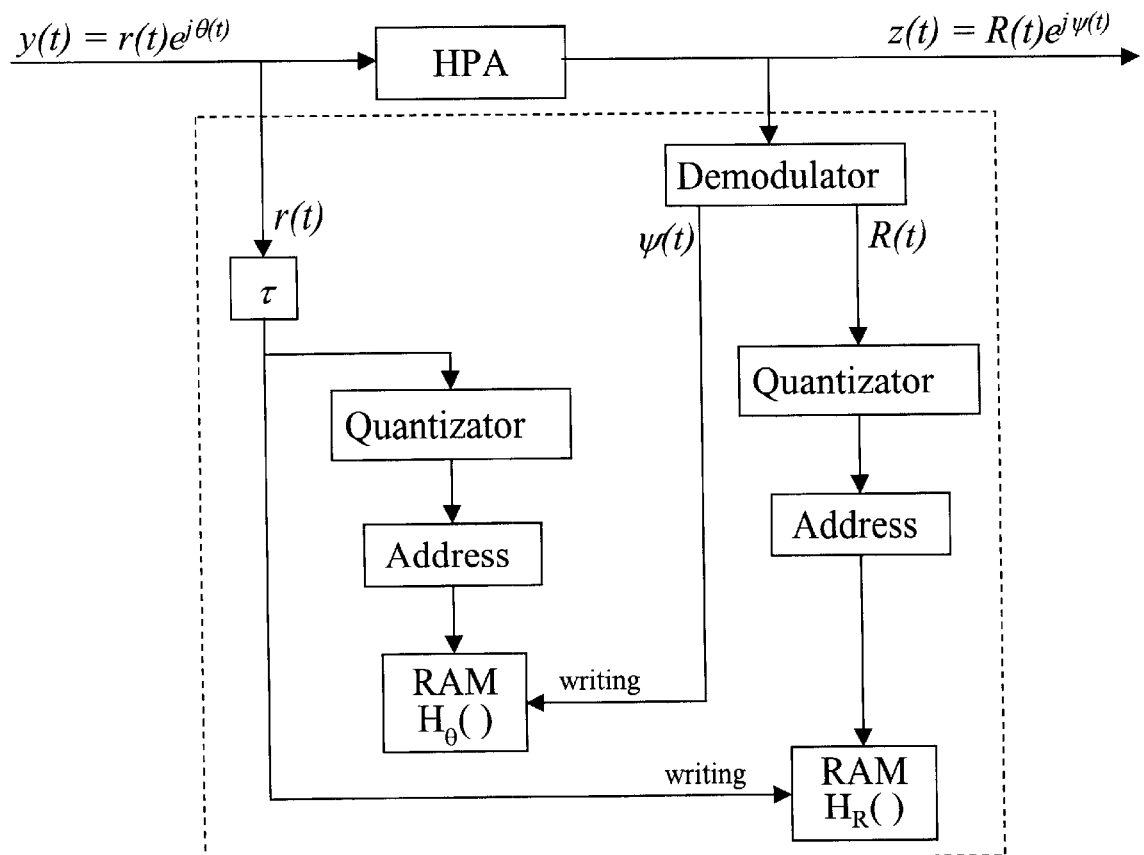
FIG. 4 is a block diagram of the estimator according to the invention.

In FIGS. 3 and 4 there is shown a detailed block diagram of the components, estimator and predistortion device, forming the precorrection system according to the present invention. They are realized in such a way that the PD is the inverse of the HPA. The adaptation consists in the punctual and real-time estimation of the HPA characteristics.

In order to be able to use a Look-Up Table, it is necessary to perform a quantization of the AM/AM and AM/PM characteristics of the PD. In particular, a uniform quantization of the input module to the PD is performed and, for each quantization interval, the value of the corresponding characteristic is assumed to be constant, hence the characteristics will be approximated by a stepped line.

As to the estimator, let $x(t)=\rho(t)e^{j\Phi(t)}$ denote the input signal to the PD, $y(t)=r(t)e^{j\Theta(t)}$ denote the signal coming out from the PD and sent as input to the amplifier, and $z(t)=R(t)e^{j\Psi(t)}$ denote the signal outputting from the latter.

According to the introduced quantization law, the AM/AM and AM/PM characteristics of the PD can be expressed as follows:

$$\begin{cases} |y| = H_R(i) \\ \angle y = H_\Theta(j) - \varphi \end{cases} \quad \text{with } \rho \in T_i \text{ and } |y| \in T_j \text{ for } i, j = 1 \ldots N \quad (2)$$

where $T_i$ is the i-th quantization interval of the set of modules which are inputs to the PD ($|x|=\rho$) and $T_j$ is the j-th quantization interval of the set of predistorted modules ($|y|=r$).

According to the above relations, the task of the estimator consists in the estimation of coefficients $H_R(i)$ and $H_\Theta(j)$ which will be stored later on in the Look-Up Table.

In order to have a precise estimation of the inverse amplitude characteristic, according to what has been said previously, it is sufficient to store into a memory, in an inverted manner, the HPA input-output pair. This implies a quantization of the axis of the input modules to the precorrector, i.e. of the HPA output module.

Hence the estimator, given the HPA input-output pair, will carry out a quantization of the output module and the corresponding value of the input module will be stored into the memory location whose index is given by the essentiality of the quantization interval $T_i$ which the output module belongs to.

As far as the estimation of the AM/PM characteristic is concerned, the quantization of the amplifier input module will be performed and the output phase value will be stored into the memory location whose address is determined by the quantization interval $T_j$ which the input module belongs to.

Said operations will be performed at every signal sample which is sent to the HPA and in such a way that the continuous adaptation of the PD characteristics to the HPA ones will be achieved.

The characteristics thus stored by the estimator will be used by the PD. In particular, the latter receives the Base-Band signal samples expressed in polar coordinates, performs a quantization of the module present at its input and, according to which interval $T_i$ it belongs to, determines the address from which the value of the predistorted module should be read, such a module will be sent, on one hand, to the HPA and, on the other hand, to a circuit able to determine the memory address j from which the value of the phase distortion introduced by the HPA should be read in coincidence with said module. Such distortion will then be subtracted from the phase of the signal sample, properly delayed, present at the input.

In order to formally describe the algorithms used by the estimator and by the precorrector, the notation introduced in the preceding paragraph is used and the look-up table is schematized by means of two N-cell memories (RAM, random access memories) $H_R(\cdot)$ and $H_\Theta(\cdot)$, into which the N values of the inverse AM/AM characteristic and of the AM/PM characteristic are respectively stored, as shows in FIG. 5.

In order to estimate the inverse amplitude characteristic, the estimator must determine the memory address "i" into which the |y|=r is to be stored. Said address will be determined by calculating the integer part of the following division:

$$i = \left[\frac{|R_n|}{1/N}\right] + 1 \qquad (3)$$

Having determined i, the estimator will store the value of r into the box $H_R(i)$.

In order to estimate the AM/PM curve, j will be determined according to the module of the signal present at the input of the HPA, going on as done previously.

$$j = int\left[\frac{|r_n|}{1/N}\right] + 1 \qquad (4)$$

and then it will be set $H_\Theta(j)=\psi$.

In equations (3) and (4), 1/N represents the length of the generic quantization interval since it is being assumed that intervals [a, b] and [A(a), A(b)] are normalized within [0,1]. In the general case, wherein said hypothesis is not verified, it is necessary to replace 1/N by the real length of the corresponding quantization interval taken into account.

The values thus stored will be utilized by the precorrector, which will determine the predistorted values to be sent to the HPA and to the estimator according to the following relations:

$$\begin{cases} \angle y = \theta_n = \varphi_n - H_\Theta\left(int\left[\frac{|r_n|}{1/N}\right] + 1\right) \\ |y| = r_n = H_R\left(int\left[\frac{|\rho_n|}{1/N}\right] + 1\right) \end{cases} \qquad (5)$$

From the arrangement of FIG. 5 one deduces that the phase predistorted value to be sent to the HPA is determined not according to the generated module $\rho_n$ but according to the predistorted module $r_n$. This because the phase distortion introduced by the amplifier depends on the module of the signal present at its input which is $r_n$.

The Look-Up Table is hence composed of the two memories $H_R$ and $H_\Theta$, whose size depends on the number (N) of quantization intervals determined as a function of the desired quantization error. It is well to notice that the quantization error threshold depends on the BER which one wishes to achieve and on the type of amplifier which is used.

In the proposed arrangement, two independent memories for storing therein the real value representing the phase and amplitude characteristics have been utilized; as an alternative, it is possible to use a sole memory for storing therein complex values expressed in polar coordinates. The estimator and the PD, will see module and phase as two independent entities to be updated and to be read by utilizing the above relations.

In order to improve the PD convergence rate, a learning technique called "broadcasting" can be used. In particular, it is assumed to group the quantization intervals into groups of M and to simultaneously update the content of the memory addresses belonging to the same set whenever one of them is addressed. M will be chosen quite large at the beginning of the learning step, thus obtaining, in a rather short time, a rough estimate of the HPA characteristics, at this point M will be gradually reduced to 1 to achieve an accurate estimate.

Another important technique for minimizing the estimation time consists in using a non-uniform quantization which is dependent on the probability distribution of the generated signal samples. For instance, one could select quantization intervals having a length inversely proportional to the access frequency and therefore to the probability distribution relating to the module of the signal entering the HPA.

Since the system according to the invention is capable of estimating the HPA characteristics after only one scan of the quantization intervals, in order to minimize the estimation times, a duly realized training signal could be sent to the HPA at the beginning of the transmission or at the rest times. A signal that would allow for the achievement of the desired result in the shortest possible time is a saw-tooth pulse having amplitude equal to the input dynamic range of the HPA, as shown in FIG. 6.

By utilizing the same architecture and the same symmetry principle of a function and of its inverse, it is possible to realize the predistortion system through the utilization of Neural Networks.

According to a universal approximation characteristic property of Neural Network based systems, according to which with a 1-N-1 multi-layer Neural Network it is possible to approximate whatever nonlinear function provided that the number N of neurons is selected large enough, a Neural Network of said type has been selected as a basic structure for realizing the predistortion system.

In order to estimate the inverse amplitude characteristic, by exploiting the described symmetry property, it will suffice to use as inputs of the Neural Network the HPA output module and to use the input module to evaluate the error utilized by the back-propagation algorithm for updating the synaptic weights. According to what has been said previously, the estimator and the PD are implemented as shown in FIG. 7.

In particular, the estimator utilizes two Neural Networks, one for estimating the AM/PM characteristics and the other one for the inverse AM/AM. The first one receives at its input the predistorted signal module $r_n$ and utilizes the phase $\Psi_n$ of the signal which is present at the output of the amplifier to evaluate the error utilized by the back-propagation algorithm for updating the weights. The second one receives at its input the amplified signal module $R_n$ and utilizes the predistorted signal module $r_n$ to evaluate the error signal. The synaptic weights thus determined will be stored in a look-up table to be utilized by the PD.

Also the PD is composed of two Neural Networks, identical with those utilized in the estimator, but not performing the updating of the weights as they use the values stored in the Look-Up Table.

The modules $\rho_n$ of the signal generated by the source is sent to the Neural Networks that simulates the inverse amplitude characteristic of the amplifier, obtaining the predistorted module $r_n$ at its output. This is sent, on the one hand, to the HPA and to the estimator and, on the other hand, as the phase distortion introduced by the amplifier depends on the module $r_n$ of the signal present at its input, to the Neural Network simulating the AM/PM characteristic to obtain the corresponding phase distortion. Therefore, the predistorted signal phase $\theta_n$ will be obtained as a difference between the source-generated signal phase $\phi_n$ and the corresponding phase distortion $\xi_n$.

In brief, in order to realize the predistortion, it is necessary to store the synaptic weights or two neural networks and their updating is performed only in the estimator, the PD is instantaneous and thus the system is adaptive.

Figures 1A, 1B:
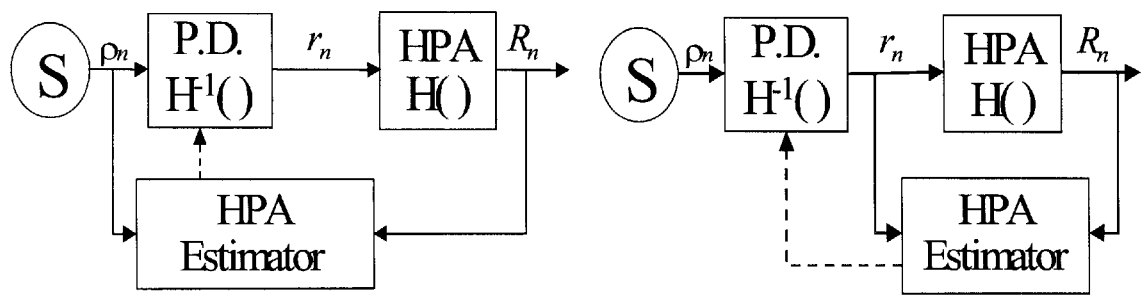
FIGS. 1a and 1b show two known architectures of precorrection systems.

At this point the advantages obtained by the present invention utilizing the BaseBand signal predistortion technique realized according to the second arrangement (FIG. 1b) will be clear, namely: a) higher flexibility as to the possible precorrection techniques (data predistortion; IF, RF or baseband signal predistortion) that can be used; b) higher flexibility as to the possible basic structures (look-up table; neural networks) that can be used for the realization of the PD; and c) various algorithms (polynomial interpolation; mathematical inversion of the direct characteristic; and instantaneous, or through recursive algorithms, inversion) can be used for estimating the inverse amplitude characteristic. Moreover, the selected technique is capable of eliminating both the in-band and out-of-band distortions until the signal exceeds the saturation level. It further can be fully implemented by digital devices and is independent of the type of modulation, it being either single carrier (N-QAM) or multicarrier (OFDM).

There has thus been shown and described a novel method and a novel device which fulfill all the objects and advantages sought therefor. Many changes, modifications, variations and other uses and applications of the subject invention will, however, become apparent to those skilled in the art after considering the specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A method of estimating at least the inverse amplitude characteristic in an amplifier for transmission systems, in which the estimation is carried out by estimator means receiving as inputs the signal samples, possibly demodulated, present both at the input and at the output of the amplifier, wherein the estimation of the inverse amplitude characteristic occurs through a non recursive algorithm.

2. A method according to claim 1, wherein said non recursive algorithm can be analytically expressed as follows: if $$\alpha \equiv (r_0(t), A[r_0(t)]) \in \{r(t), A[r(t)]\} \forall r_0(t) \in [a,b] \rightarrow \beta \equiv (A[r_0(t)], r_0(t)) \in \{R(t), A^{-1}(R(t))\} \forall R_0(t) \in [A(a), A(b)]] \quad (1).$$

3. A method according to claims 1, wherein it further includes the step of estimating the inverse AM/AM characteristic by symbol-by-symbol inverting the amplifier input-output pair, thus obtaining a point and storing the thus obtained point into memory means.

4. A method according to claim 3, wherein it includes the step of performing a uniform quantization of the input module to the predistortion device and, for every quantization interval, of assuming the value of the corresponding characteristic as being constant.

5. A method according to claim 1, wherein the convergence rate of the predistortion device is increased by grouping the quantization intervals into groups of M elements and by simultaneously updating the contents of the memory addresses belonging to the same set whenever one of them is addressed.

6. A method according to claim 1, wherein the convergence rate of the predistortion device is increased by using a non uniform quantization dependent on the probability distribution of the generated signal samples.

7. A method according to claim 1, wherein the estimation times are minimized by sending a training signal to the amplifier at the beginning of the transmission and/or at the rest times, said training signal being preferably a saw-tooth pulse having amplitude equal to the input dynamic range of the amplifier.

8. A method according to claim 1, wherein Neural Networks are used.

9. A device for estimating at least the inverse amplitude characteristic in an amplifier for transmission systems, wherein said device comprises estimator means receiving as inputs the signal samples, possibly demodulated, present both at the input and at the output of the amplifier and wherein the estimation of the inverse amplitude characteristic occurs through a non recursive algorithm.

10. A linearizing device comprising a device for estimating at least the inverse amplitude characteristic in an amplifier for transmission systems, wherein said device comprises estimator means receiving as inputs the signal samples, possibly demodulated, present both at the input and at the output of the amplifier and wherein the estimation of the inverse amplitude characteristic occurs through a non recursive algorithm.

* * * * *